United States Patent
Robinson et al.

(10) Patent No.: US 10,290,500 B2
(45) Date of Patent: May 14, 2019

(54) SPIN ON HARD MASK MATERIAL

(71) Applicants: Alex Phillip Graham Robinson, Birmingham (GB); Andeas Frommhold, Dera (DE); Alan Brown, Worcestershire (GB); Tom Lada, Somerville, MA (US)

(72) Inventors: Alex Phillip Graham Robinson, Birmingham (GB); Andeas Frommhold, Dera (DE); Alan Brown, Worcestershire (GB); Tom Lada, Somerville, MA (US)

(73) Assignee: Irresistible Materials LTD, Birmingham (GB)

( * ) Notice: Subject to any disclaimer, the term of this patent is extended or adjusted under 35 U.S.C. 154(b) by 0 days.

(21) Appl. No.: 15/511,416

(22) PCT Filed: Dec. 4, 2015

(86) PCT No.: PCT/US2015/064089
§ 371 (c)(1),
(2) Date: Mar. 15, 2017

(87) PCT Pub. No.: WO2016/058008
PCT Pub. Date: Apr. 14, 2016

(65) Prior Publication Data
US 2017/0278703 A1    Sep. 28, 2017

Related U.S. Application Data

(60) Provisional application No. 62/061,294, filed on Oct. 8, 2014.

(51) Int. Cl.
*H01L 21/027* (2006.01)
*H01L 21/02* (2006.01)
(Continued)

(52) U.S. Cl.
CPC .......... *H01L 21/0274* (2013.01); *B05D 1/005* (2013.01); *B05D 3/002* (2013.01); *B05D 3/0254* (2013.01); *C01B 32/152* (2017.08); *C09D 163/04* (2013.01); *C09D 177/00* (2013.01); *H01L 21/02115* (2013.01); *H01L 21/02282* (2013.01); *H01L 21/02318* (2013.01); *H01L 21/3065* (2013.01); *H01L 21/3081* (2013.01);
(Continued)

(58) Field of Classification Search
CPC .................................................. H01L 21/0274
See application file for complete search history.

(56) References Cited

U.S. PATENT DOCUMENTS 8,758,979 B2 * 6/2014 Robinson ............... B82Y 30/00
430/270.1
2005/0142413 A1 * 6/2005 Kimura ............... H01M 8/0213
429/492
(Continued)

FOREIGN PATENT DOCUMENTS

WO    WO 2013117908 A1 *  8/2013 ............... C09C 1/44

Primary Examiner — Megan McCulley
(74) Attorney, Agent, or Firm — The Patent Practice of Szmanda & Shelnut LLC; James G. Shelnut; Charles R. Szmanda

(57) ABSTRACT

Disclosed and claimed herein is a composition for forming a spin-on hard-mask, having a fullerene derivative and a crosslinking agent. Further disclosed is a process for forming a hard-mask.

12 Claims, 12 Drawing Sheets

(51) Int. Cl.
*H01L 21/3065* (2006.01)
*H01L 21/308* (2006.01)
*H01L 21/311* (2006.01)
*B05D 1/00* (2006.01)
*B05D 3/00* (2006.01)
*B05D 3/02* (2006.01)
*C09D 163/04* (2006.01)
*C09D 177/00* (2006.01)
*C01B 32/152* (2017.01)

(52) U.S. Cl.
CPC .. *H01L 21/31122* (2013.01); *H01L 21/31138* (2013.01)

(56) References Cited

U.S. PATENT DOCUMENTS

| | | | |
|---|---|---|---|
| 2005/0205136 A1* | 9/2005 | Freeman | A01K 11/006 137/554 |
| 2015/0241773 A1* | 8/2015 | Robinson | G03F 7/0384 430/285.1 |
| 2017/0130024 A1* | 5/2017 | Boday | C08L 61/22 |

* cited by examiner

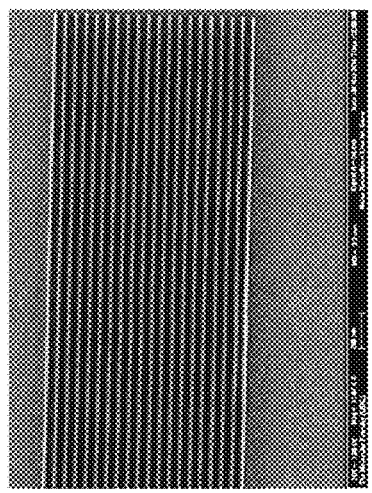
Fig. 5C
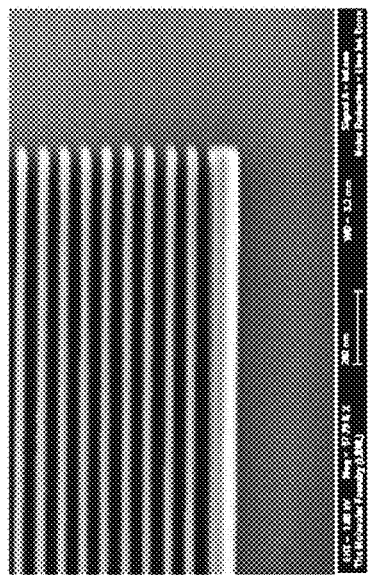
Fig. 5B
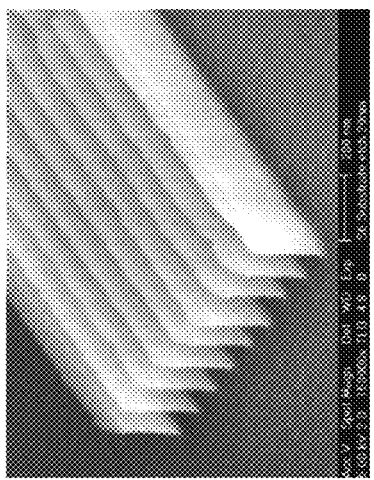
Fig. 5A
Fig. 5

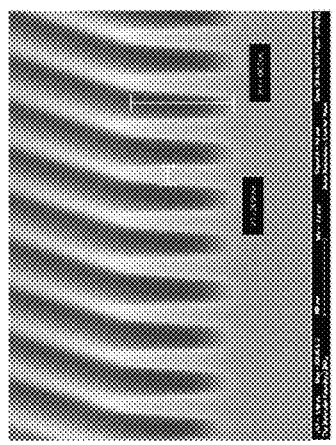
Fig. 6C
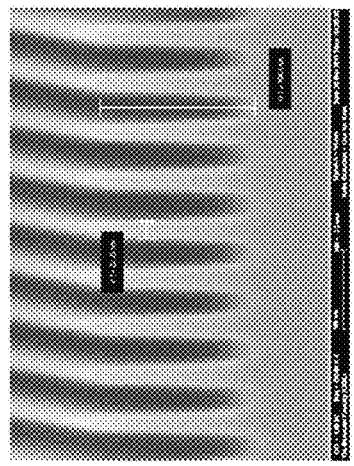
Fig 6B
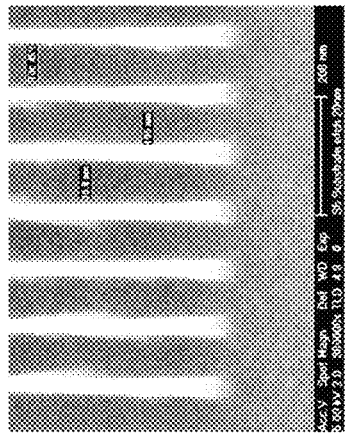
Fig. 6A
Fig. 6

Spin speed versus thickness for IM-HM-1 from surface profilometry

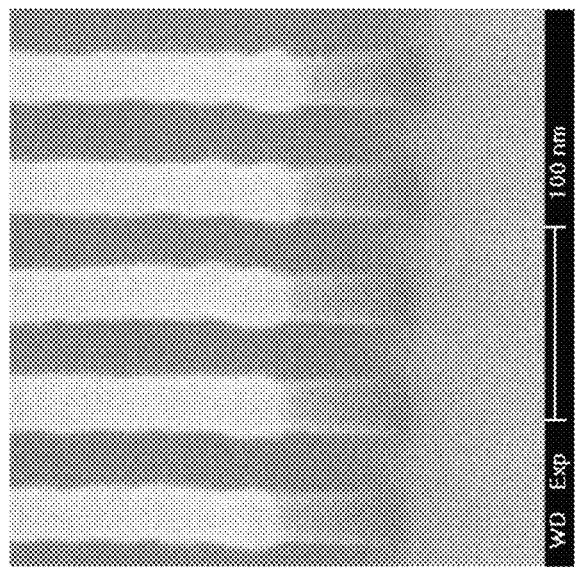
54nm pitchdense lines transferred into
Fig. 8B
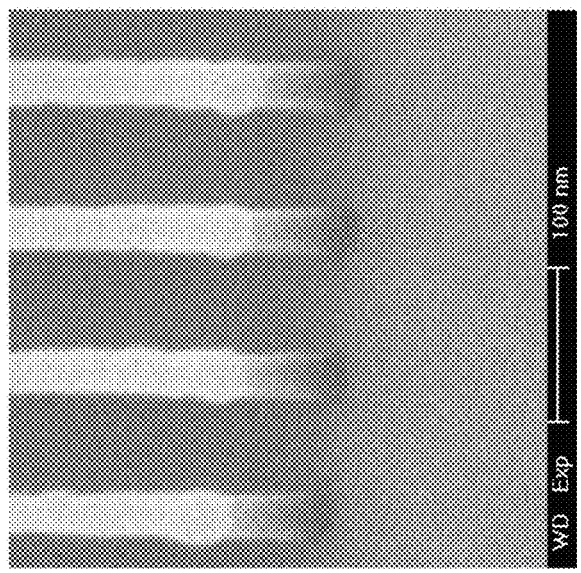
27nm sparse lines transferred into
Fig. 8A
Fig. 8

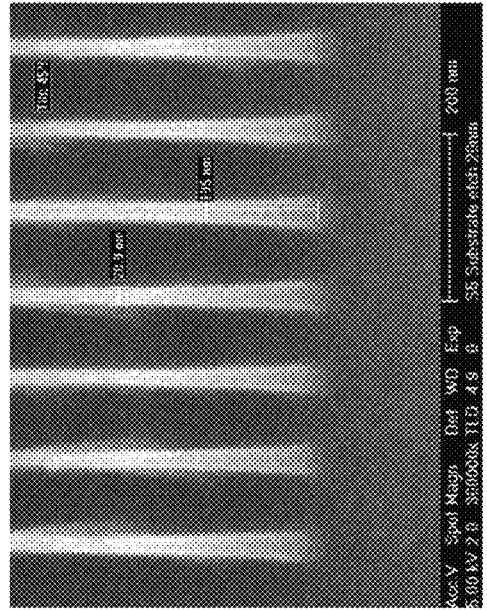
Fig. 9B
20nm sparse lines etched on into silicon
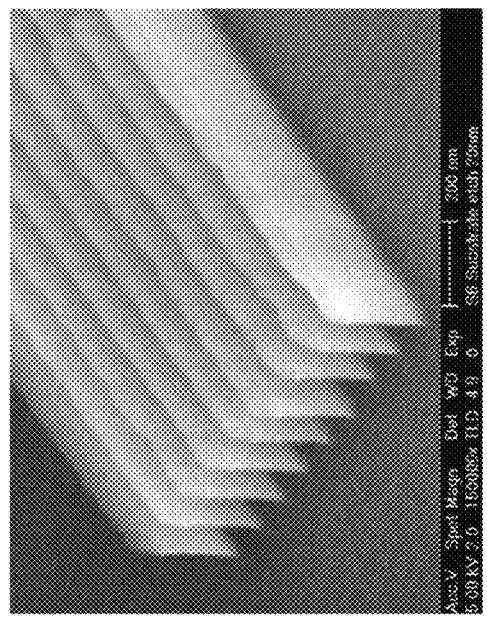
Fig 9A
30 nm lines transferred into fullerene hard mask
Fig. 9

Spin speed versus thickness data to date – from surface profilometry

Relative improvement in etch resistance with new lower cost formulation

SPIN ON HARD MASK MATERIAL

FIELD OF THE INVENTION

The present application for patent is in the field of imaging for semiconductor manufacturing and more specifically is in the field of etch masking using spin-on formulations.

BACKGROUND

Minimum feature sizes of semiconductor devices continue to shrink to enable increasing device densities. One method of achieving such high density patterning is to use thin photoresist films to mitigate problems such pattern collapse of high aspect-ratio resist features upon development. One possible solution to the problem involves using a high-resolution, high sensitivity and high etch durability fullerene resist. However, even though the aspect ratios produced by such resists may be as high as 5:1, the overall etch depth is limited significantly by the usable resist thickness.

A multilayer hard-mask stack can allow a further increase of the aspect ratio of the etched image. Such methods may use a thick amorphous carbon, deposited in—vacuo by chemical vapor deposition, which is then coated with a thin-silicon rich layer. A thin photoresist film is then sufficient to pattern the silicon-rich layer; thus avoiding pattern collapse. The silicon-rich layer is in-turn used as a hard-mask to pattern the carbon, giving a high aspect ratio carbon pattern suitable for providing a mask for etching the silicon wafer. By alternating from silicon to carbon rich materials and vice versa optimization of the overall etch selectivities of various substrates can be accomplished.

In recent years, vapor deposited materials have been replaced with spin-on etch masks. For example, as reported by van Delft et al., J. Vac. Sci. Technol. B, 18 (2000) 3419, a novolak-hydrido silsesquioxane (HSQ) bilayer stack was used to achieve 40 nm half-pitch resolution with an aspect ratio of 3.25:1 as well as isolated 40 nm lines with an aspect ratio of 20:1. However, fluorine-based etching of the underlying HSQ layer, resulted in swelling of the patterned novolak features, leading to wave-like distortions.

Therefore, there remains a need for a spin-on hard-mask material that withstands fluorine-based etching of underlying layers without distortion, so that high resolution patterns can be produced.

BRIEF DESCRIPTION OF THE DRAWINGS

FIG. 5 shows SEM images of 3 compositions (FIGS. 5A-5C) of the current disclosure.

FIG. 6 shows SEM images of 3 patterns (FIGS. 6A-8C) etched in silicon of the patterns from FIGS. 5A-5C, respectively.

FIG. 8 shows SEM images of the successful transfer of 27 nm sparse lines and 54 nm pitch dense lines (patterned by electron beam exposure of a thin experimental resist layer) into a >100 nm thick film of a hard mask formulation of the current disclosure.

FIG. 9 shows SEM images of a pattern defined in a hardmask material of the current disclosure (FIG. 9A) and the resultant etch pattern that results (FIG. 9B).

DETAILED DESCRIPTION OF THE DRAWINGS

Figure 1:
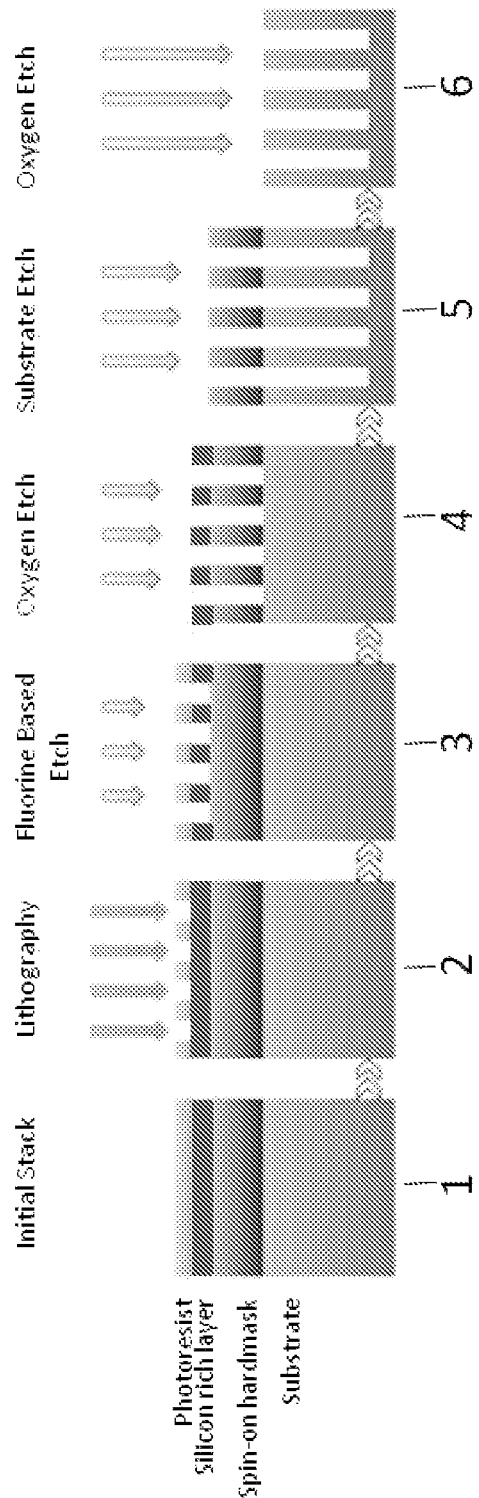
FIG. 1 illustrates the process for producing high aspect ratio, high resolution features using a spin-on hard-mask.

FIG. 1 shows a process for producing high aspect ratio, high resolution features using a spin-on hard-mask. In this embodiment, the initial stack 1 is a substrate; onto which has been coated a spin-on hard-mask, a silicon rich layer and a photoresist. The lithographic step 2 patterns the photoresist. In scheme 3, the patterned photoresist serves as an etch mask for the silicon rich layer, which, in turn serves as an etch mask for the underlying spin-on hard-mask layer 4. The hard-mask layer is then used as an etch mask for the substrate 5 and the silicon rich layer may be etched as depicted or may require a separate etch step. Finally, an oxygen etch is used to remove the spin-on hard-mask 6. The embodiment shown in FIG. 1 is but one example for illustration and is not intended to be limiting. For example, a photosensitive composition containing silicon may be employed instead of photoresist disposed on a silicon rich layer.

Figure 2:
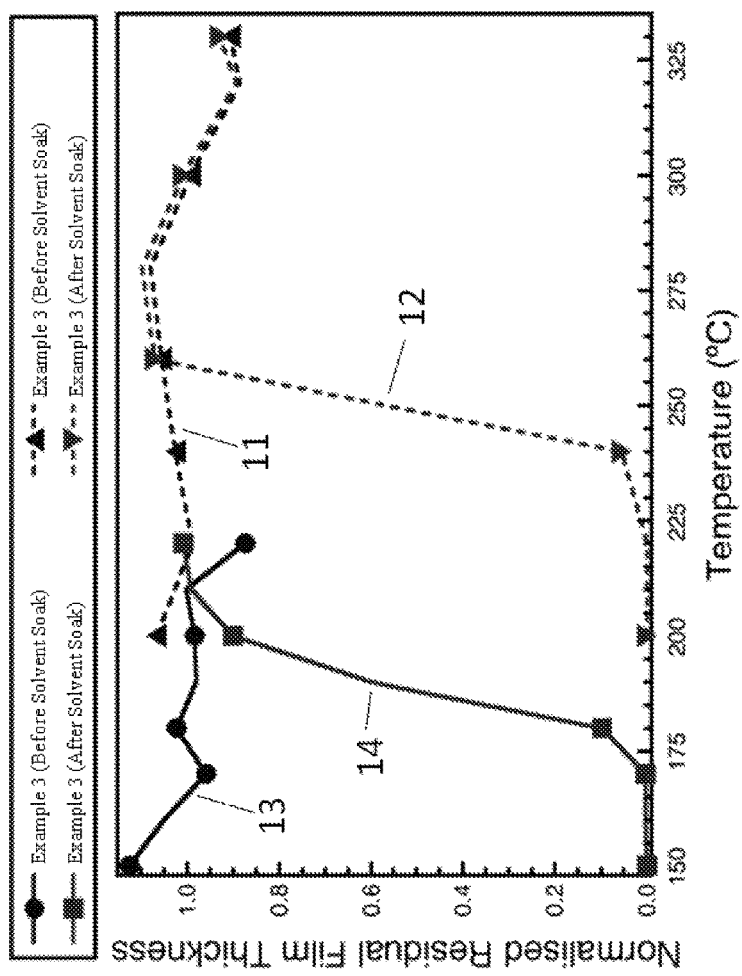
FIG. 2 illustrates the results of forming a hard-mask film with the materials described herein, heating the films and performing a solvent soak.

FIG. 2 shows results of forming a hard-mask film with the materials described herein, heating the films and performing a solvent soak. Specifically, the formulations from Example 2 and Example 3 (described infra) are spin coated onto a substrate and baked at various temperatures. Their thicknesses were compared before and after soaking in a chlorobenzene:isopropyl alcohol (1:1 w/w) solution. Turning to the films of Example 2, the normalized thickness of the film as baked at different temperatures, but not exposed to a solvent soak 11 is compared to the same films baked at different temperatures but exposed to the solvent soak 12. Turning to the films of Example 3, the normalized thickness of the film as baked at different temperatures, but not exposed to a solvent soak 13 is compared to the same films baked at different temperatures but exposed to the solvent soak 14.

Figure 3:
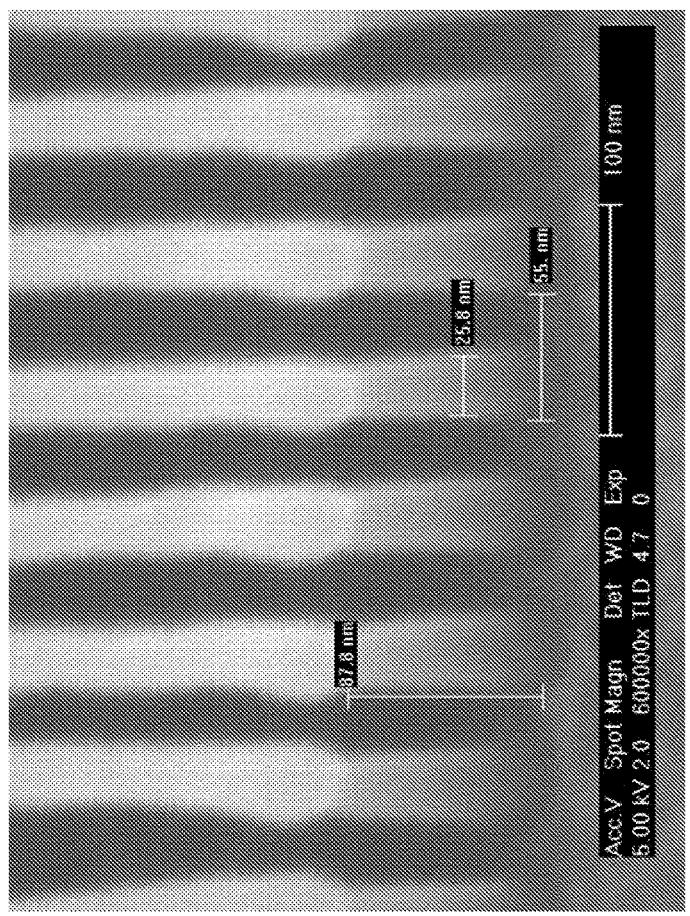
FIG. 3 shows 25 nm lines and spaces etched into about 100 nm of carbon according to the scheme set forth in FIG. 1.

FIG. 3 shows 25 nm lines and spaces etched into about 100 nm of carbon according to the scheme set forth in FIG. 1. Details of the process used to form the image shown in FIG. 3 are provided infra.

Figure 4:
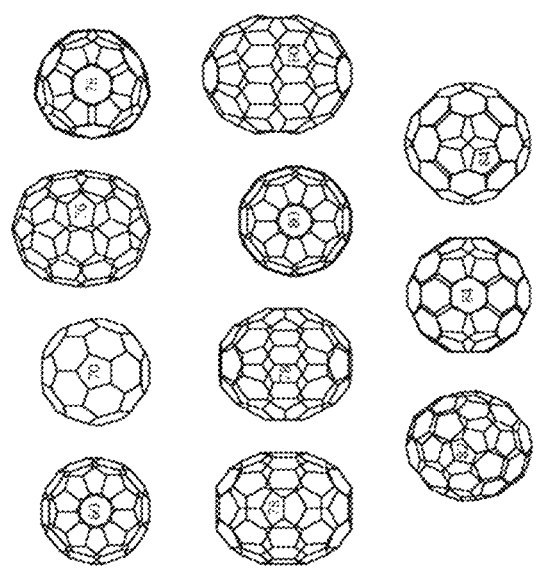
FIG. 4 shows examples of one or more additionally sized fullerenes based on C76, C78, C80, C82, or C84 fullerene molecules.

FIG. 4 shows examples of other fullerene materials that are useful in the current disclosure, for example, fullerenes based on C76, C78, C80, C82, or C84 fullerene molecules.

FIG. 5 shows SEM images of 3 compositions (FIGS. 5A-5C) of the current disclosure.

FIG. 6 shows SEM images of 3 patterns (FIGS. 6A-8C) etched in silicon of the patterns from FIGS. 5A-5C, respectively.

Figure 7:
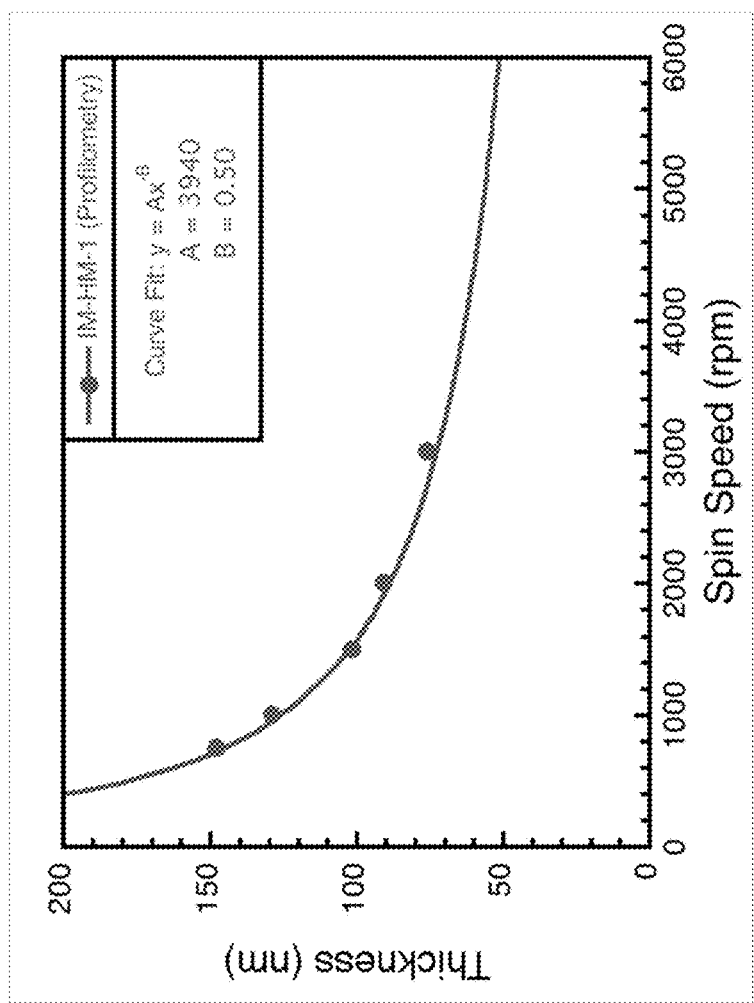
FIG. 7 shows a graph relating film thickness to spin speed of a formulation of the current disclosure.

FIG. 7 shows a graph relating film thickness to spin speed of a formulation of the current disclosure.

FIG. 8 shows SEM images of the successful transfer of 27 nm sparse lines and 54 nm pitch dense lines (patterned by electron beam exposure of a thin experimental resist layer) into a >100 nm thick film of a hard mask formulation of the current disclosure.

FIG. 9 shows SEM images of a pattern defined in a hardmask material of the current disclosure (FIG. 9A) and the resultant etch pattern that results (FIG. 9B).

Figure 10:
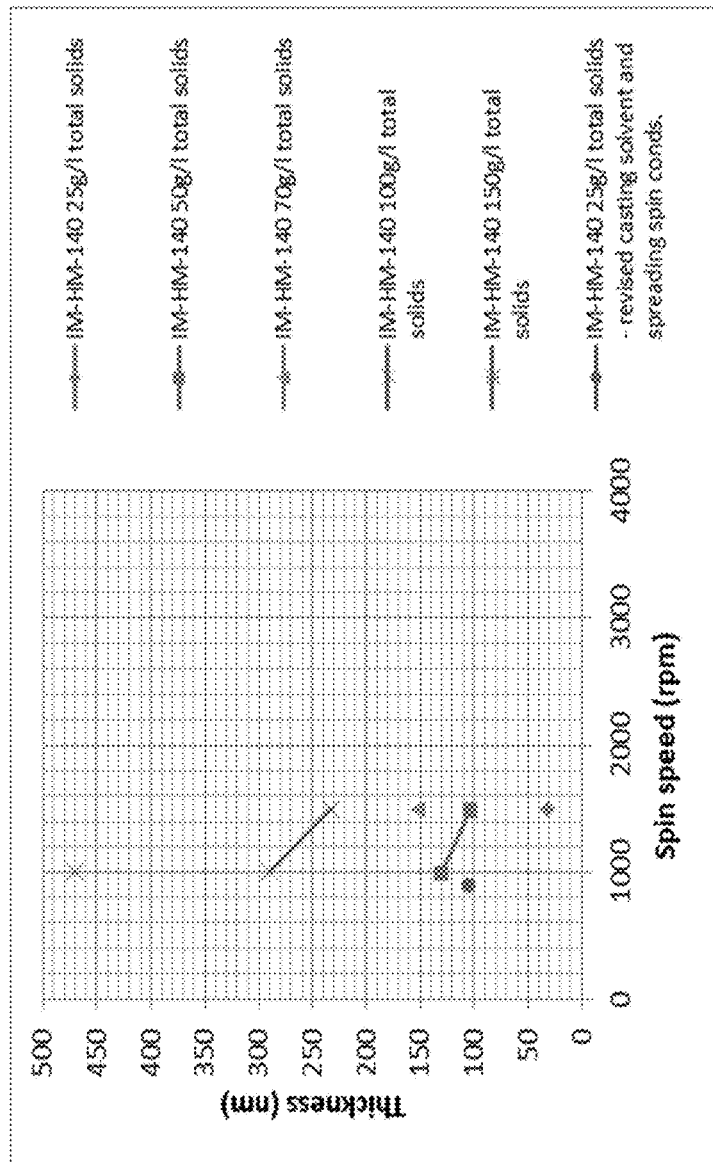
FIG. 10 shows a graph of film thickness versus spin speed using different concentrations of a formulation of the current disclosure.

FIG. 10 shows a graph of film thickness versus spin speed using different concentrations of a formulation of the current disclosure.

Figure 11:
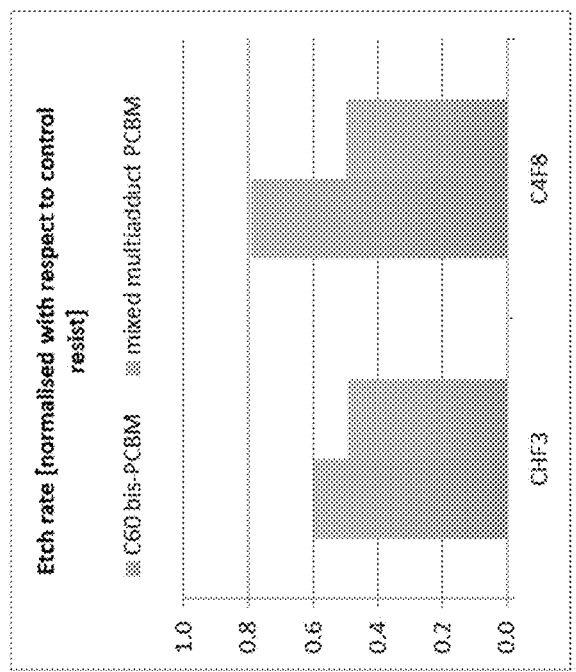
FIG. 11 shows a graph comparing etch resistance of the current formulations compared to a standard formulation.

FIG. 11 shows a graph comparing etch resistance of the current formulations compared to a standard formulation.

Figure 12:
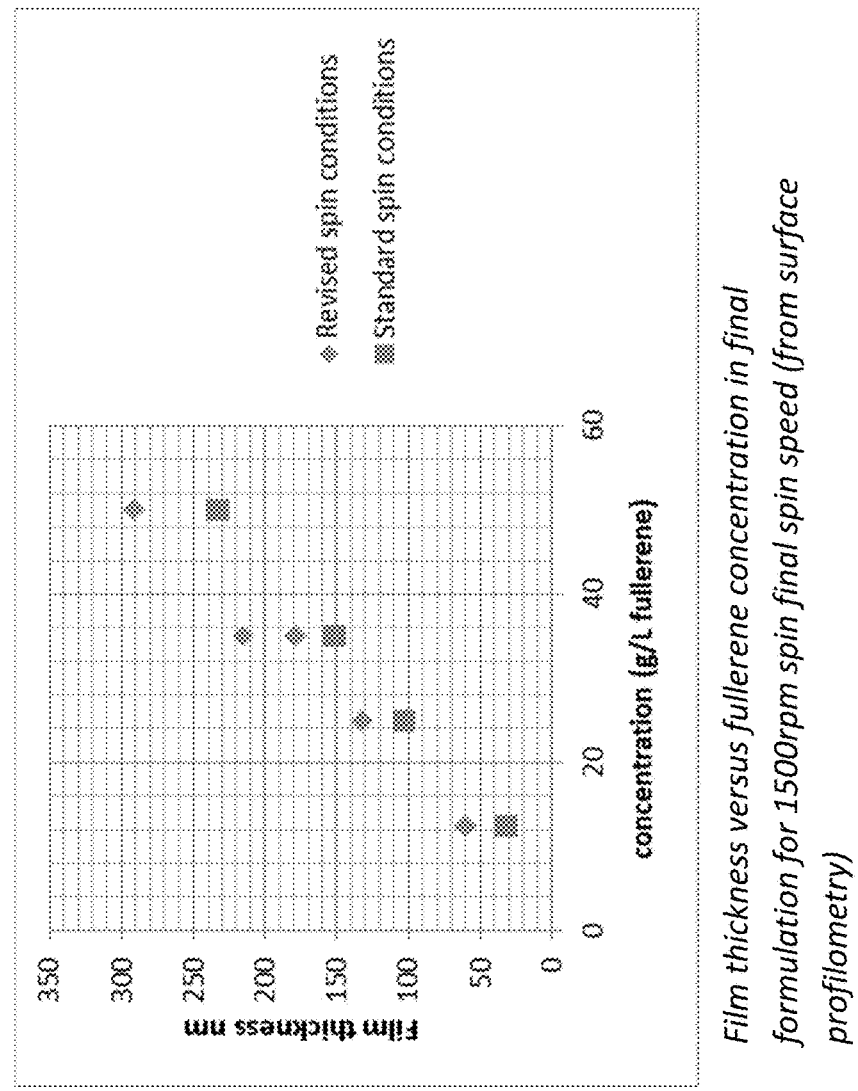
FIG. 12 shows a graph of the relationship of film thickness as a function of fullerene concentration at a fixed 1500 rpm final spin speed.

FIG. 12 shows a graph of the relationship of film thickness as a function of fullerene concentration at a fixed 1500 rpm final spin speed.

DETAILED DESCRIPTION

As used herein, the conjunction "and" is intended to be inclusive and the conjunction "or" is not intended to be exclusive unless otherwise indicated. For example, the phrase "or, alternatively" is intended to be exclusive. As used herein, an "alicyclic" compound is an organic compound that is both aliphatic and cyclic. Alicyclic compounds may contain one or more all-carbon rings which may be either saturated or unsaturated, but do not have aromatic character. Alicyclic compounds may or may not have aliphatic side chains attached. As used herein, the term "exemplary" is used to indicate an example and is not necessarily used to indicate preference.

Disclosed and claimed herein is composition for forming a spin-on hard-mask, comprising: a fullerene derivative, expressed by the general formula (I)

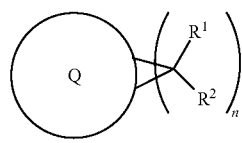

I wherein n is an integer of 1-6, Q, the number of carbon atoms in the fullerene, is 60, 70, 76, 78, 80, 82, or 84, $R^1$ represents a first substituent comprising an ester, an alcohol, a phenol, an amine, an amide, an imide, or a carboxylic acid and $R^2$ represents a second substituent comprising hydrogen, a halogen, a $C_6$-$C_{20}$ aryl group, a $C_1$-$C_{20}$ alkyl group, an ester, an alcohol, a phenol, an amine, an amide, an imide, or a carboxylic acid; and a crosslinking agent comprising two or more thermally or catalytically reactive groups.

Further disclosed and claimed herein is a composition for forming a spin-on hard-mask of the above embodiment which further comprises a thermal acid generator.

Further disclosed and claimed herein are compositions for forming a spin-on hard-mask of the above embodiments which further comprise a photoacid generator.

Further disclosed and claimed herein are compositions for forming a spin-on hard-mask of the above embodiments which further comprise a solvent such as polyethylene glycol monomethyl ether acetate, ethyl lactate, anisole, toluene, chloroform, chlorobenzene, o-dichloro benzene, m-dichloro benzene, p-dichloro benzene, o-xylene, m-xylene, p-xylene, carbon disulfide or combinations thereof.

Further disclosed and claimed herein are compositions for forming a spin-on hard-mask of the above embodiment where the compositions contain more than one fullerene material of differing size with one of the fullerenes being a C60 fullerene and another being a C70 fullerene.

Further disclosed and claimed herein are compositions for forming a spin-on hard-mask of the above embodiment where the compositions contain more than these two fullerenes, for example it may contain one or more additionally sized fullerenes based on C76, C78, C80, C82, or C84 fullerene molecules.

Further disclosed and claimed herein are compositions for forming a spin-on hard-mask of the above embodiment where the compositions contain fullerenes substituted with one or more substituents on the fullerenes, for example, between 1 and 6 substituent.

Further disclosed and claimed herein are compositions for forming a spin-on hard-mask of the above embodiment where the compositions contain fullerenes substituted with one or more substituents which are carboxylic acids.

Further disclosed and claimed herein are compositions for forming a spin-on hard-mask of the above embodiment where the compositions comprise crosslinkers that are amines, such as for example, anilines. Some of the crosslinkers may contain 2 or more amines, such as dianilines, and may be substituted on aromatic backbones. For example the crosslinker may be fluorene dianiline (4,4' (9-fluorenylidene)dianiline) as described herein or triphenylmethane amines. Other crosslinkers include the polyaromatic amines.

Further disclosed and claimed herein is a process for forming a spin-on hard-mask, comprising: providing a composition of any of the above embodiments comprising the steps of forming a coating on a substrate; and heating the substrate and the coating at a temperature sufficient to cross-link the coating.

The general formula (I) is a representation of a derivatized fullerene molecule having 1-6 methano groups. Fullerenes can have different allotropes, including $C_{60}$, $C_{70}$, $C_{76}$, $C_{78}$, $C_{80}$, $C_{82}$, and $C_{84}$ as shown in FIG. 4, indicating the cage structure but not the bonding. In some cases, different allotropes may have the same number of carbons.

In accordance with the subject matter disclosed herein, Fullerenes may be substituted across double bonds by a methano group to form a three-membered ring. In one embodiment, the methano group bridges across a vertex wherein two 6-membered rings meet to form a so-called [6, 6] bridge as shown in (II) (back carbons not shown). In another embodiment, a ring-opening [6, 5] substitution by the methano group may obtain to form a fulleroid structure. In some cases, however, the ring-opened [6, 5] fulleroid structure, may rearrange to a [6,6] bridged fullerene structure upon heating. Synthesis techniques for methanofullerenes are known in the art, such as in Fukashi et al., *Beilstein J. Org. Chem.* (2008), 4, No. 33. doi:10.3762/bjoc.4.33, and Hummelen et al., Org. Chem. (1995), 60, 532-538.

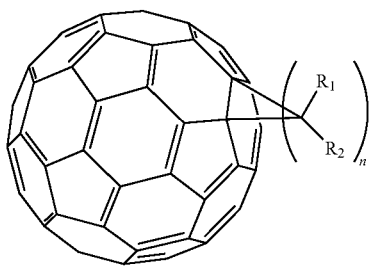

(III)

In accordance with the subject matter disclosed herein, the crosslinking agent may be chosen from an epoxy phenolic novolak resin, an epoxy cresylic novolak resin, an epoxy bisphenol A resin, an epoxy bisphenol novolak resin, an alkylolmethyl melamine resin, an alkylolmethyl glycoluril resin, an alkylolmethyl guanamine resin, an alkylomethyl benzo-buanamine resin, a glycosyl urea resin, or an isocyanates resin. Crosslinkers may also be derived from amines or anilines or other nitrogen containing materials. The nitrogen crosslinkers may contain 2 or more functions amine, aniline, or other nitrogen containing functional group.

Suitable amine-based crosslinkers include the melamines manufactured by Cytec of West Paterson, N.J., such as CYMEL™ 300, 301, 303, 350, 370, 380, 1116 and 1130; benzoguanamine resins such as CYMEL™ 1123 and 1125; the glycoluril resins CYMEL™ 1170, 1171 and 1172; and the urea-based resins, BEETLE™ 60, 65 and 80, also available from Cytec, West Paterson, N.J. A large number of similar amine-based or amidoplast compounds are commercially available from various suppliers.

Epoxy phenolic and cresylic novolak resins are shown in (IV), wherein X may be H, $CH_3$ and n may be 0-20. Epoxy bisphenol A resins are shown in an idealized structure (V), wherein n may be 0-20. Epoxy bisphenol Z resins are shown in an idealized structure (VI), wherein n may be 0-20. Similar "epoxy bisphenol" crosslinking agents are contemplated. For example, resins based on the diglycidyl ethers of 1,1-bis(4-hydroxyphenyl)-1-phenyl-ethane, 2,2-bis(4-hydroxyphenyl)hexafluoropropane, 2,2-bis(4-hydroxyphenyl)butane, bis-(4-hydroxyphenyl)diphenylmethane, 2,2-bis(3-methyl-4-hydroxyphenyl)propane, bis(4-hydroxyphenyl)-2,2-dichlorethylene, 1,1-bis(4-hydroxyphenyl)ethane, bis(4-hydroxydiphenyl)methane, 2,2-bis(4-hydroxy-3-isopropyl-phenyl)propane, 1,3-bis(2-(4-hydroxyphenyl)-2-propyl)benzene, bis(4-hydroxyphenyl)sulfone, 1,4-bis(2-(4-hydroxyphenyl)-2-propyl)benzene, 5,5'-(1-methylethyliden)-bis[1,1'-(bisphenyl)-2-ol]propane, 1,1-Bis(4-hydroyphenyl)-3,3,5-trimethyl-cyclohexane and combinations with any of the foregoing may be used.

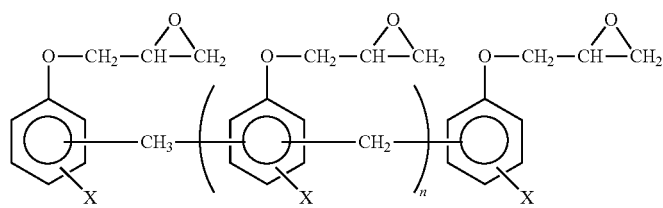

(IV)

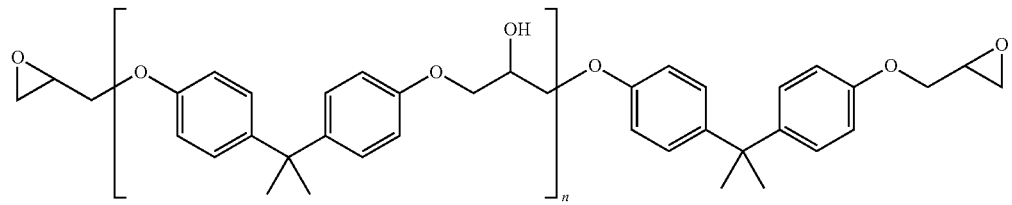

(V)

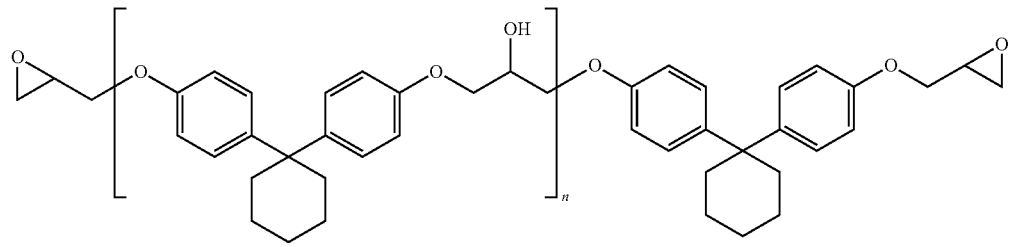

(VI)

(VII)

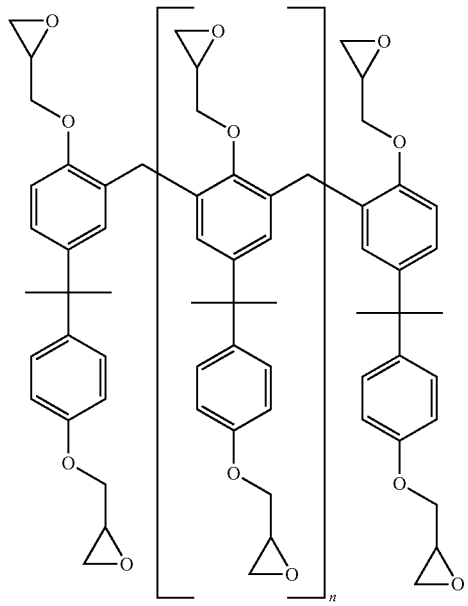

Other suitable crosslinkers include multifunctional amines and multifunctional anilines, such as for example, 4,4' (9 Fluorenylidene)dianiline, trianilino-methanes and polyaromatic multi-substituted amines.

In accordance with the subject matter disclosed herein, suitable thermal acid generators may include alkyl esters of organic sulfonic acids, alicyclic esters of organic sulfonic acids, amine salts of organic sulfonic acids, 2-nitrobenzyl esters of organic sulfonic acids, 4-nitrobenzyl esters of organic sulfonic acids, benzoin esters of organic sulfonic acids, β-hydroxyalkyl esters of organic sulfonic acids, β-hydroxycycloalkyl esters of organic sulfonic acids, triaryl sulfonium salts of organic sulfonic acids, alkyl diaryl sulfonium salts of organic sulfonic acids, dialkyl aryl sulfonium salts of organic sulfonic acids, trialkyl sulfonium salts of organic sulfonic acids, diaryl iodonium salts of organic sulfonic acids, alkyl aryl sulfonium salts of organic sulfonic acids, or ammonium salts of tris(organosulfonyl) methides.

Onium salts comprise cations and anions. Exemplary cations of onium salts include triaryl sulfonium, alkyl diaryl sulfonium, dialkyl aryl sulfonium, trialkyl sulfonium, diaryl iodonium, alkyl aryl iodonium, dialkyl iodonium, triaryl selenonium, alkyl diaryl selenonium, dialkyl aryl selenonium, trialkyl selenonium. Without limitation, specific examples of cations in onium salts include triphenyl sulfonium, tri(p-tolyl) sulfonium, 1,4-phenylenebis(diphenylsulfonium) (having a charge of +2), diphenyliodonium, and bis(4-tert-butylphenyl)iodonium.

Further, without limitation, exemplary anions in onium salts include the halides, $PF_6^-$, $AsF_6^-$, $SbF_6^-$, $SbCl_6^-$, and $BF_4^-$. In addition, without limitation, anions based on oxo-acids may be used. Among these are $C_1$-$C_{10}$ perfluoroalkane sulfonates such as trifluoro methane sulfonate, perfluoro butane sulfonate and perfluoro octane sulfonate, $C_1$-$C_{18}$ linear, branched and alicyclic alkane sulfonates, such as dodecane sulfonate, methane sulfonate and camphor sulfonate, $C_1$-$C_{18}$ aromatic and substituted aromatic sulfonates such as toluene sulfonate and dodecylbenzene sulfonate, $C_1$-$C_{18}$ fluorinated aryl sulfonates, such as the trifluoromethyl benzene sulfonates, pentafluoro benzene sulfonate and the like, $C_1$-$C_{18}$ carboxylates and halogenated carboxylates such as benzoate, acetate, chloroacetate, dichloroacetate, trichloroacetate, trifluoroacetate, perfluoropentanoate, pentafluoropropanoate, perfluorooctanoate, perfluorobenzoate, and the like. Further, without limitation, suitable anions include $C_1$-$C_{20}$ tris (alkane sulfonyl)methanides, tris (fluoralkane sulfonyl)methanides, ($R_3C^-$), bis (alkane sulfonyl) imides, and bis (fluoroalkane sulfonyl) imides, ($R_2N^-$), such as tris(trifluoromethylsulfonyl)methanide, bis(trifluoromethylsulfonyl)imide and the like. Further, without limitation, oxo-acid anions can be bound to polymers so that acid diffusion out of the hard-mask material can be limited. Among these are polymeric acids such as poly(vinyl sulfonate), poly(styrene-4-sulfonate), poly(tetrafluoroethylene-co-1,1,2,2-tetrafluoro-2-(1,2,2-trifluorovinyloxy)ethanesulfonate), poly((meth)acrylic acid) and the like. In addition, sulfonated and fluorosulfonated (meth)acrylic monomers may be incorporated into a variety of polymers. It will be appreciated that oxo-acid anions may comprise other elements such as Se, P, As, Sb to form selenonates, phosphonates, arsenonates, stibonates and the like. Thermal acid generators of the ester type may comprise, for example, any of the foregoing oxo-acid anions to form carboxylate, sulfonate, selenonate, phosphonate, arsenonate, and stibononate esters.

Further, without limitation, the ester-type and onium type thermal acid generators may be used as photoacid generators at wavelengths in which they absorb electromagnetic radiation of can act as electron acceptors from other components of the hard-mask composition. In addition, triazine-type photoacid generators may be used. Suitable halogenated triazines include halomethyl-s-triazines. Suitable halogenated triazines include for example, 2-[1-(3,4-benzodioxolyl)]-4,6-bis(trichloromethyl)-1,2,5-triazine, 2-[1-(2,3-benzodioxolyl)]-4,6-bis(trichloromethyl)-1,3,5-triazine, 2-[1-(3,4-benzodioxolyl)]-4,6-bis(tribromomethyl)-1,3,5-triazine, 2-[1-(2,3-benzodioxolyl)]-4,6-bis(tribromomethyl)-1,3,5-triazine, 2-(2-furylethylidene)-4,6-bis(trichloromethyl)1,3,5-triazine, 2-[2-(5-methylfuryl)ethylidene]-4,6-bis(trichloromethyl)-1,3,5-triazine, 2-[2-(4- methylfuryl)ethylidene]-4,6-bis(trichloromethyl)-1,3,5-triazine, 2-[2-(3-methylfuryl)ethylidine]-4,6-bis-(trichloromethyl)-1,3,5-triazine, 2-[2-(4,5-dimethylfuryl)ethylidene]-4,6-bis(trichloromethyl)-1,3,5-triazine, 2-[2-(5-methoxyfurylethylidene]-4,6-bis(trichloromethyl)-1, 3,5-triazine, 2-[2-(4-methoxyfurypethylidene]-4,6-bis(trichloromethyl)-1, 3,5-triazine, 2-[2-(3-methoxyfuryl)ethylidene]-4,6-bis(trichloromethyl)-1, 3,5-triazine, 2-[2-(4,5-dimethoxy-furyl)ethylidene]-4,6-bis(trichloromethyl)-1,3,5-triazine, 2-(2-(2-furfylethylidene)-4,6-bis(tribromomethyl)-1,3,5-triazine, 2-[2-(5-methylfuryl)ethylidene]-4,6-bis(tribromomethyl)-1,3, 5-triazine, 2-[2-(4-methylfuryl)-ethylidene]-4,6-bis(tribromomethyl)-1,3,5-triazine, 2-[2-(3-methylfuryl)ethylidene]-4,6-bis(tribromomethyl)-1,3, 5-triazine, 2-[2-(4,5-dimethoxyfuryl)ethylidene]-4,6-bis(tribromomethyl)-1,3,5-triazine, 2-[2-(5-methoxyfurypethylidene]-4,6-bis(tribromomethyl)-1,3,5-triazine, 2-[2-(4-methoxyfuryl)ethylidene]-4,6-bis(tribromomethyl)-1,3,5-triazine, 2-[2-(3-methoxyfuryl)ethylidene]-4,6-bis(tribromomethyl)-1,3,5-triazine, 2-[2-(4,5-dimethoxyfuryl)ethylidene]-4,6-bis(tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(2-(1-naphthyl)-4,6-bis(trichloromethyl)-1,3, 5-triazine, 2-(1-naphthyl)-4,6-bis(tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2(3,4,5-trimethoxystyryl)-4,6-bis(trichloromethyl)-1,3,5-triazine, 2-(3-chloro-1-phenyl)-4,6-bis(trichloromethyl)-1,3,5-triazin e, 2-(3-chlorophenyl)-4,6-bis(tribromomethyl)-1,3,5-triazine and the like. Other triazine type photoacid generators useful in the present invention are disclosed in U.S. Pat. No. 5,366,846, herein incorporated by reference.

The s-triazine compounds are condensation reaction products of certain methyl-halomethyl-s-triazines and aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924-30 (1969).

In accordance with the subject matter disclosed herein, the total solids in the claimed compositions may suitably comprise 1 g/l to 100 g/l. In accordance with the subject matter disclosed herein total solids in the claimed compositions may further suitably comprise 2.5 g/l to 75 g/l. In accordance with the subject matter disclosed herein total solids in the claimed compositions may still further suitably comprise 5 g/l to 50 g/l.

In accordance with the subject matter disclosed herein, the fullerene loading may suitably comprise 10% to 90% of the total solids in the composition. In accordance with the subject matter disclosed herein, the loading of the crosslinking agent may suitably comprise 90% to 10% of the total solids in the composition. In accordance with the subject matter disclosed herein, the loading of the thermal acid generator may suitably comprise 0% to 40% of the total solids in the composition. In accordance with the subject matter disclosed herein, the photoacid generator may suitably comprise 0% to 40% of the total solids in the composition. All percentages of solids composition are by weight.

Other materials may be present in the composition to enhance film forming characteristics. These include surfactants, wetting agents, rheology modifiers, antifoaming agents and the like.

In accordance with the subject matter disclosed herein, a film formed with any of the described compositions can be heated at a temperature sufficient to cause the crosslinking of the coated film. The presence of a thermal acid generator may lower the temperature at which crosslinking occurs. An exemplary temperature range may be from 80° C. to 350° C. Another exemplary temperature range may be from 100° C. to 250° C. Still another exemplary temperature range may be from 120° C. to 160° C.

In accordance with the subject matter disclosed herein, a film formed with any of the described compositions can be exposed to electromagnetic radiation at an exposure dose sufficient to cause the crosslinking of the coated film either during heating, before heating or at ambient temperature. The presence of a photoacid generator may lower the temperature at which crosslinking occurs. Exemplary exposure wavelengths may be 190 nm to 520 nm, depending on the sensitivity of the photoacid generator. Further exemplary exposure wavelengths may be 225 nm to 400 nm, depending on the sensitivity of the photoacid generator. An exemplary exposure dose range may be from 0.1 $mJ/cm^2$-1000 $mJ/cm^2$. Another exemplary exposure dose range may be 1 $mJ/cm^2$ to 500 $mJ/cm^2$. Still another exemplary exposure dose range may be 10 $mJ/cm^2$ to 100 $mJ/cm^2$.

Without limitation, coating may suitably be accomplished by spray coating, blade coating, spin coating or combinations thereof. With regard to spin coating, for example, spin speeds may suitably range from 100 rpm to 8000 rpm. As a further example, spin speeds may suitably range from 200 rpm to 2000 rpm. As a still further example, spin speeds may range from 800 rpm to 1500 rpm. Spin times may suitably range from 10 sec to 150 sec. Substrates, coated by any of the above methods may suitably be softbaked before crosslinking. Suitable softbake temperatures may range from 50° C. to 150° C.

The following examples are illustrative and are not intended to limit the scope of the appended claims. For example, various substrates, methods of substrate preparation, etch chemistries and conditions, or resist types and exposure conditions may suitably be used.

Example 1 (Substrate Preparation)

Silicon (100) substrates (Rockwood Electronic Materials, n-type) were used for all experimental procedures. Square chips, 2 by 2 cm in size, were cut from a wafer using a Disco DAD 321 wafer dicer. The samples were cleaned using semiconductor grade chemicals from Riedel-de Haën. Samples were washed ultrasonically for 15 minutes in isopropyl alcohol (WA), then rinsed for 1 minute in deionised (DI) water (Purite Neptune, 18.2 MΩ cm). A hydrogen terminated surface was then prepared by dipping the substrates in $H_2SO_4$ (95-98%):$H_2O_2$ for 10 minutes, DI water for 1 minute and dilute HF for 1 minute, followed by rinsing in DI water for a further minute before drying with nitrogen. Substrates were stored under vacuum after preparation and used within 2 days.

TABLE 1

| Example | Fullerene, % total solids | Cross Linker, % total Solids | Thermal Acid Generator % Total solids | Composition Solids % |
|---|---|---|---|---|
| 2 | 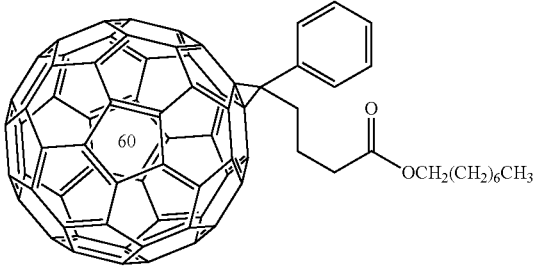 [6,6]-Phenyl-C61 butyric acid octyl ester (Nano-C Corp.), 50% of total solids | 50% | 0% | 7% |
| 3 | 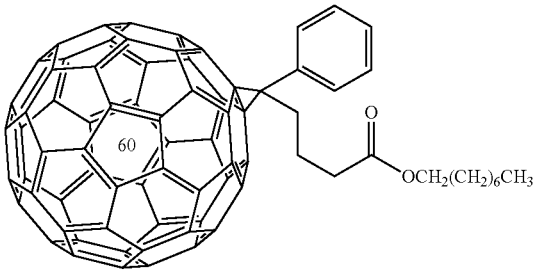 [6,6]-Phenyl-C61 butyric acid octyl ester (Nano-C Corp.), 40% of total solids | 40% | 20% | 7% |
| 4 | 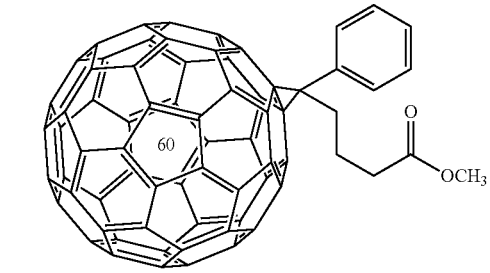 [6,6]-Phenyl-C61 butyric acid methyl ester (Nano-C Corp.), 50% of total solids | 50% | 0% | 7% |

Examples 2-4 (Sample Preparation)

Compositions for forming a spin-on hard-mask were prepared according to Table 1. The solvent used for all compositions was chloroform. The cross linking agent was Poly[(o-cresyl glycidyl ether)-co-formaldehyde], available from Sigma Aldrich company. The thermal acid generator was bis(tert-butyl phenyl) iodonium hexafluorophosphate, supplied by TCI Europe Ltd. Solids and the solvent were charged in a bottle and were dissolved quickly.

Films of the hard-mask were prepared by spin coating on the substrates of Example 1 at a spin speed of 1000 rpm for 60 sec, at a spin speed of 1000 rpm for the sample of Example 2, 1000 rpm for the sample of Example 3 and 1000 for the sample of Example 4. After spin coating the films were baked for five minutes at up to 330° C. After baking, Example 2 gave a film thickness of about 300 nm, Example 3 gave a film thickness of about 250 nm, Example 4 gave a film thickness of about 350 nm.

Example 5 (Solubility Testing)

In order to enable further processing, the spin-on hard-mask should be rendered insoluble in typical solvents for resist and further spin-on-hard-mask layers. FIG. 2 shows the normalized film thickness, spin coated from the formulations of Example 2 and Example 3, before and after dipping in monochlorobenzene (MCB):IPA 1:1 solution. For temperatures above 190° C. the film, spin coated from the formulation of Example 3, having a thermal acid generator, was rendered insoluble, while a temperature of 260° C. was required to achieve the same for the film spin coated from Example 2, which did not have a thermal acid generator.

Example 6 (Producing an Etched Image)

Films of the hard-mask material coated from the formulation of Example 2 were prepared by spin coating on the substrate of Example 1 with a spin speed of 1000 rpm and baked for 5 minutes at a temperature of 300° C. to produce a thickness of about 300 nm.

After preparation of a 300 nm hard-mask film, a 40 nm thick silicon layer was deposited by sputtering at an argon pressure of $1 \times 10^{-2}$ mbar for 2 minutes with 250 W RF power. Finally an electron beam resist, SAL 601™, available from Dow Electronic Materials Company, was spin coated on top of the silicon layer. The resist was patterned using an FEI XL30 SFEG scanning electron microscope equipped with a pattern generator (Raith Elphy Plus). 25 nm lines and spaces were patterned and then etched into the silicon thin film using an Oxford Instruments PlasmaPro NGP80 Inductively Coupled Plasma (ICP) etching system. Silicon substrates were attached using vacuum grease to a sacrificial silicon wafer to ensure good thermal contact. The sacrificial wafer was mechanically clamped to the lower electrode, which is equipped with helium backside pressure to ensure good thermal control of the sample during the etching process. The pattern was transferred into the silicon topcoat using a 20 second mixed mode $SF_6/C_4F_8$ ICP etch. $SF_6$ flow rate was 25 sccm and $C_4F_8$ flow rate 30 sccm. An RF power of 20 W and ICP power of 220 W were applied.

Transfer of the pattern from the silicon to the hard-mask was accomplished with an oxygen plasma etch was used. In order to minimize undercutting of the carbon, and maintain vertical sidewalls during the etch, at a chamber pressure of 1.5 mT was maintained. Etch duration was 20 seconds with an $O_2$ flow rate of 15 sccm. RF power of 100 W and ICP power of 300 W.

Finally, the hard-mask pattern was transferred into the silicon substrate with another mixed mode $SF_6/C_4F_8$ ICP etch, using an: $SF_6$ flow rate of 20 sccm, $C_4F_8$ flow rate 30 sccm, RF power 20 W, ICP power 220 W. FIG. 3 shows the result in which an aspect ratio of about 3.4 was obtained.

Although the present invention has been shown and described with reference to particular examples, various changes and modifications which are obvious to persons skilled in the art to which the invention pertains are deemed to lie within the spirit, scope and contemplation of the subject matter set forth in the appended claims.

In another embodiment the composition contains more than one fullerene material of differing size with one of the fullerenes being a C60 fullerene and another being a C70 fullerene. Some of the compositions of the current disclosure may contain more than these two fullerenes, for example it may contain one or more additionally sized fullerenes based on C76, C78, C80, C82, or C84 fullerene molecules.

In some embodiments there may be one or more substituents on the fullerenes, for example, between 1 and 6 substituent. These substituents may be carboxylic acids.

Of course the compositions may contain both more than one fullerene of differing sizes as described above each containing carboxylic acid substituents.

Some of the crosslinkers described in the current disclosure are amines, such as for example, anilines. Some of the crosslinkers may contain 2 or more amines, such as anilines, and may be substituted on aromatic backbones. For example the crosslinker may be fluorene dianiline (4,4' (9-fluorenylidene)dianiline) as described herein or triphenylmethane amines. Other crosslinkers include the polyaromatic amines.

Not to be held to theory it is believed that, in the case of the PCBA (carboxylic acid fullerene) with fluorene dianiline, the crosslinked product is a polyamide.

Other examples and results are shown on the further examples

Further Examples

|  | IM-HM-110 | IM-HM-120 | IM-HM-140 | IM-HM-220* | IM-HM-240* |
|---|---|---|---|---|---|
| Carbon content | 86.7% | 84.0% | 83.7% | 87.6% | 87.5% |
|  | $C_{60}$ mono-PCBM/ POLY-OCGEF | $C_{60}$ bis-PCBM/POLY-OCGEF | Mixed multi adduct PCBM/ POLY-OCGEF | $C_{60}$ bis-PCBA/Fluorene dianiline crosslinker | Mixed multi adduct PCBA/ Fluorene dianiline crosslinker |
| Solvent | Anisole | Cyclohexanone | Cyclohexanone | Cyclohexanone | Cyclohexanone |
| Crosslinking Bake | 300° C. for 300 seconds | 300° C. for 120 seconds | 300° C. for 120 seconds | 250° C. for 180 seconds* | 250° C. for 300 secs* |
| Thermal Stability | | | | | |
| Mass loss at 400° C. (TGA) | Not tested | 14.2% (scrapped film) | ~13.7% | 8% | |
| Thickness loss at 400° C. | 5% | 14.2% | 12.6% | 7% | |
| Etch performance | | | | | |
| Etch rate in silicon plasma (SF6/C4F8) nm/sec (control material SAL-601) | 1.17 (control 1.24) | 0.98 (control 1.24) | 0.82 (control 1.65) | 0.76 (control 1.27) | |
| Normalized etch rate | 0.94 | 0.79 | 0.50 | 0.60 | |
| Resolution (limited by e-beam exposure tool used) | | 20 nm sparse, 30 nm dense | 25 nm on pitch 60 | 25 nm on pitch 60 | |
| Example images | | | | | |
| Patterned hard mask | | See FIG. 5A | See FIG. 5B | See FIG. 5C | |
| Etched into silicon | | See FIG. 6A | See FIG. 6B | See FIG. 6C | |

| | IM-HM-110 | IM-HM-120 | IM-HM-140 | IM-HM-220* | IM-HM-240* |
|---|---|---|---|---|---|
| Etch rate in oxygen plasma nm/sec (control material Brewer DUV-44) | 0.8 (control 5.8) | 3.6 (control 5.8) | 3.0 (control 5.8) | 3.1 (control 5.8) | 2.2 (control 5.8) |

The formulated PCBA/dianiline solutions have been shown to change with time (stored at 5° C.) in that The spin speed thickness relationship changes The thickness of films spun with a given set of conditions increases and The amount of baking required to fully crosslink the material reduces i.e. reduced crosslinking bake temperature or reduced time It is suggested that the material is crosslinking in solution.

Investigations are underway. Nano-C have a revised purification for the $C_{60}$ bis-PCBA, which is now washed of acetic and hydrochloric acid. Previously there may have been some residual acetic acid. A small batch has been made for initial trials. There will be no issue scaling up this process.

Thermal Stability Data at 300 and 350° C.

| | | 300° C. | 350° C. |
|---|---|---|---|
| IM-HM-120 | Mass loss (TGA) | 3.4% | 7.0% |
| | Thickness loss | 2.4% | 7.0% |
| IM-HM-140 | Mass loss (TGA) | ~3% | ~6% |
| | Thickness loss | 0.8% | 4.4% |
| IM-HM-220 | Mass loss (TGA) | 1.3% | 3.1% |
| | Thickness loss | 0% | 3.0% |

Film Thickness Measurement with Surface Profilometry (Dektak) and Ellipsometry

It should be noted that from our measurements that measurement using ellipsometry suggests a significantly thicker film thickness than measurement by Dektak, as illustrated in the table below.

| | Dektak | Ellipsometer |
|---|---|---|
| IM-HM-120 (50 g/l total solids) C60 bis-PCBM/POLY-OCGEF | ~143 nm | 163 nm |
| IM-HM-140 (50 g/l total solids) MiMu-PCBM/POLY-OCGEF | ~130 nm | 155 nm |
| IM-HM-220 (50 g/l total solids) C60 bis-PCBA/Fluorene dianiline crosslinker | ~124 nm | 134 nm |
| IM-HM-240 (50 g/l total solids) MiMu-PCBA/Fluorene dianiline crosslinker | ~130 nm | 149 nm |

All films spun at 1000 rpm

Preparation and Process for IM-HM-120 Hard Mask—50 Grams/Liter Total Solids

C60 bis-PCBM
POLY-OCGEF crosslinker

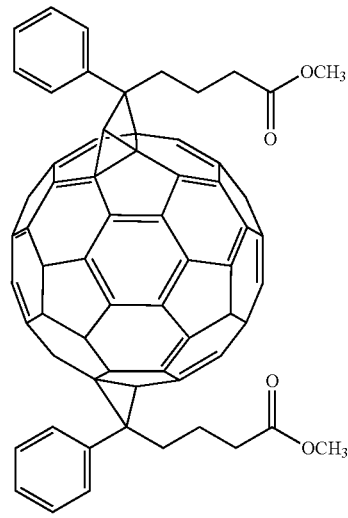

C60 bis-PCBM—$C_{60}$ bis-PCBM (Phenyl $C_{60}$ Butyric Acid Methyl Ester)

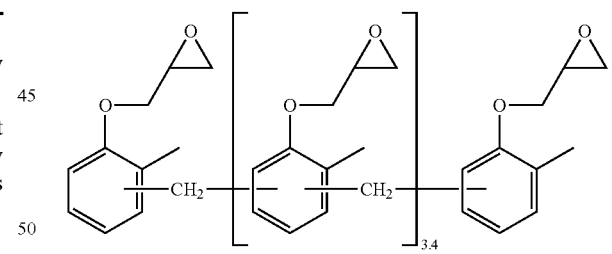

POLY-OCGEF—Poly[(o-cresyl glycidyl ether)-co-formaldehyde, MW=~1270

Preparation of Hard Mask Solution from Solids

Prepare solution of bis-PCBM in cyclohexanone at the concentration of 50 grams/liter, using ultrasonic agitation to aid process as required. Filter with cyclohexanone compatible syringe filters, pore size 0.02 µm or equivalent (50 grams/liter is slightly above the solubility limit).

Prepare solution of POLY-OCGEF crosslinker in cyclohexanone at the concentration of 50 grams/liter, using ultrasonic agitation to aid process as required.

Mix equal volumes of each solution to give the required volume of hard mask solution. Use ultrasonic agitation to aid mixing.

Substrate Pretreatment

Substrates should be clean and dry prior to applying the hard mask solution. Standard wafer cleaning and drying methods may be applied as appropriate. In some circumstances it has been found beneficial to spin deposit the hard mask film layers onto a hydrophobic (i.e. HF cleaned) surface.

No specific pre-spin dehydration bake is necessary, unless required to prevent disruption to the hard mask film due to outgassing of any underlying films during the post spin bake at 300° C.

Note—The material is not compatible with the use of HMDS adhesion promoter

Coating of Hard Mask

The film thickness versus spin speed relationship is shown in FIG. 7.

Recommended coating conditions are:
   a) Static dispense: Typically 0.6 mL is used to coat a 100 mm silicon wafer.
   b) Spread Cycle: Ramp to 500 rpm at ~167 rpm/second acceleration and hold for 5 seconds.
   c) Spin Cycle: Ramp to final spin speed in <1 second and hold for 60 seconds.

Bake

After coating, the hard mask film should be baked at a temperature of 300° C. for five minutes, on a hotplate, to render the film insoluble.

Recent trials suggest shorter bakes (down to two minutes) will render the film insoluble.

Removal

Removal is by oxygen plasma ash or reactive ion etch.

Solvents Considered/Tried for this Basic Bis-PCBM Hard Mask Formulation

Solvents include cyclohexanone, anisole, chloroform, chlorobenzene

A lower concentration formulation has been supplied following a specific customer request for a 50 nm film thickness.

Process for IM-HM-120 Hard Mask—25 Grams/Liter Total Solids

Coating of Hard Mask

Recommended coating conditions for a 50 nm thick film are:
   a) Static dispense: Typically 0.6 mL is used to coat a 100 mm silicon wafer.
   b) Spread Cycle: Ramp to 500 rpm at ~167 rpm/second acceleration and hold for 5 seconds.
   c) Spin Cycle: Ramp to 1500 rpm in <1 second and hold for 60 seconds.

Bake

After coating, the hard mask film should be baked at a temperature of 300° C. for 5 minutes seconds, on a hotplate, to render the film insoluble.

Recent trials suggest shorter bakes (down to two minutes) will render the film insoluble.

Removal

Removal by oxygen plasma ash or reactive ion etch is recommended.

Preparation and Process IM-HM-140—25 to 150 Grams Per Liter Total Solids

Mixed Multiadduct-PCBM (MiMu-PCBM)
   POLY-OCGEF crosslinker

Preparation of Hard Mask Solution from Solids—Example for 50 Grams Per Liter Total Solids Prepare solution of mixed multiadduct-PCBM (MiMu-PCBM) in cyclohexanone at the concentration of 50 grams/liter, using ultrasonic agitation to aid process as required. Filter with cyclohexanone compatible syringe filters, pore size 0.02 μm or equivalent.

| Spin on Carbon Hard Mask Data Sheet | | | |
|---|---|---|---|
| Variant: IM-HM-120 | Carbon Content (wt %): 84% | | |
| Etching (ICP, $SF_6/C_4F_8$) | Etch Rate (nm/s) | 0.98 nm/s | |
| | Etching Technique | ICP mixed mode etching | |
| | Selectivity to Silicon | 4.5:1 | |
| | Control Resist | SAL601 | |
| | Control Etch Rate | 1.24 nm/s | |
| Etching (ICP, $SF_6/CHF_3$) | Etch Rate (nm/s) | 0.8 nm/s | |
| | Etching Technique | ICP mixed mode etching | |
| | Selectivity to Silicon | 14.8:1 | |
| | Control Resist | SAL601 | |
| | Control Etch Rate | 1.34 nm/s | |
| Solvent Compatibility (Coating) | Casting Solvent | Cyclohexanone | |
| | Castable Thickness (Cyclohexanone) | Up to 130 nm | |
| | Other solvent options available | Multilayers up to 1.3 μm have been prepared (from other solvents) | |
| Solvent Compatibility (Elution after hardening) | Thickness Loss (PGME, PGMEA) | No dissolution after 1 min immersion | |
| | Thickness Loss (Ethyl Lactate) | No dissolution after 1 min immersion | |
| | Thickness Loss (EEP, Anisole) | No dissolution after 1 min immersion | |
| | Thickness Loss (MCB) | No dissolution after 1 min immersion | |
| | Thickness Loss (Cyclohexanone) | No dissolution after 1 min immersion | |
| | Thickness Loss (TMAH 25%) | No dissolution after 1 min immersion | |
| Thermal Characteristics (under $N_2$) | Thickness Loss | Thickness Loss (%) @ 300° C. 2.4% after 5 min | |
| | | Thickness Loss (%) @ 350° C. 7.0% after 5 min | |
| | | Thickness Loss (%) @ 400° C. 14.2% after 5 min | |
| | Mass Loss (TGA) | Mass Loss (%) @ 300° C. | 3.4% |
| | | Mass Loss (%) @ 350° C. | 7.0% |
| | | Mass Loss (%) @ 400° C. | 14.2% |
| Young Modulus | After 300° C. bake, 1 μm film | 4.7 GPa (Reduced Modulus) | |
| Hardness | After 300° C. bake, 1 μm film | 1.15 GPa | |
| Roughness | Substrate | Bare Silicon | SoC Coated Si |
| | Average Roughness | 0.28 nm | 0.28 nm |
| | RMS roughness | 0.35 nm | 0.36 nm |
| | Peak to valley | 4.57 nm | 3.12 nm |
| Images | See FIG. 9A and 99 | | |

Prepare solution of POLY-OCGEF crosslinker in cyclohexanone at the concentration of 50 grams/liter, using ultrasonic agitation to aid process as required.

Mix equal volumes of each solution to give the required volume of hard mask solution. Use ultrasonic agitation to aid mixing.

Substrate Pretreatment

Substrates should be clean and dry prior to applying the hard mask solution. Standard wafer cleaning and drying methods may be applied as appropriate. In some circumstances it has been found beneficial to spin deposit the hard mask film layers onto a hydrophobic (i.e. HF cleaned) surface.

No specific pre-spin dehydration bake is necessary, unless required to prevent disruption to the hard mask film due to outgassing of any underlying films during the post spin bake at 300° C.

Note—The material is not compatible with the use of HMDS adhesion promoter

Coating of Hard Mask

The film thickness versus spin speed relationship is shown in below.

Standard spin conditions are;
 a) Static dispense: Typically 0.6 mL is used to coat a 100 mm silicon wafer.
 b) Spread Cycle: Ramp to 500 rpm at ~167 rpm/second acceleration and hold for 5 seconds.
 c) Spin Cycle: Ramp to final spin speed in <1 second and hold for 60 seconds.

Limited data is currently available. However this data suggests concentrations 150 g/l, 100 g/l, 50 g/and 25 g/l would allow us to cover from about 10 nm to about 500 nm, with speeds from 1000 to 5000 rpm. Trials to generate this more comprehensive spin speed versus thickness data are underway.

It is understood that for very large wafers the maximum usable spin speed is 3000 rpm. See FIG. 10.

The revised solvent was PGME: Cyclohexanone 1:1. The hard mask was formulated by;
 a) preparing a solution of mixed multiadduct-PCBM (MiMu-PCBM) in cyclohexanone at the concentration of 25 grams/liter,
 b) preparing solution of POLY-OCGEF crosslinker in PGME at the concentration of 25 grams/liter, and
 c) mixing equal volumes of each solution to give the required volume of hard mask solution.

Attempts to increase the PGME content beyond 50% resulted in poor quality films after baking.

The revised spin conditions were:
 a) Static dispense: Typically 0.6 mL is used to coat a 100 mm silicon wafer.
 b) Extended Spread Cycle: 30 second ramp to 500 rpm and hold for 5 seconds.
 c) Spin Cycle: Ramp to final spin speed of 900 rpm in <1 second and hold for 60 seconds.

The figure below shows the result of etch resistance trials using a >100 nm thick film based on this mixed multiadduct PCBM derivative, spun from a PGME/cyclohexanone casting solvent with half the concentration of fullerene derivative (and POLY-OCGEF crosslinker). As can be clearly seen the etch resistance of the new formulation is further improved, as compared to the standard formulation. See FIG. 11.

The SEM micrographs of FIG. 8 show initial images of the successful transfer of 27 nm sparse lines and 54 nm pitch dense lines (patterned by electron beam exposure of a thin experimental resist layer) into a >100 nm thick film of the new lower cost formulation hard mask. Note—the resolution and line quality is limited purely by the electron beam patterning tool used—not the IM hard mask.

Other revised solvent systems tried include:
cyclohexanone, xylene and ethyl lactate in a 7:2:1 ratio
cyclohexanone and xylene at an 8:2 ratio Film Thickness Versus Concentration for Spin Speed of 1500 Rpm The relationship between film thickness versus fullerene concentration (in the final formulation) at a fixed 1500 rpm final spin speed, is shown in FIG. 12.

Standard spin coating conditions are:
 a) Static dispense: Typically 0.6 mL is used to coat a 100 mm silicon wafer.
 b) Spread Cycle: Ramp to 500 rpm at ~167 rpm/second acceleration and hold for 5 seconds.
 c) Spin Cycle: Ramp to final spin speed in <1 second and hold for 60 seconds.

Revised spin coating conditions are:
 a) Static dispense: Typically 0.6 mL is used to coat a 100 mm silicon wafer.
 b) Extended Spread Cycle: 30 second ramp to 500 rpm and hold for 5 seconds.
 c) Spin Cycle: Ramp to final spin speed in <1 second and hold for 60 seconds.

Preparation and Process for IM-HM-220 Hard Mask
 $C_{60}$ bis-PCBA
 Fluorene dianiline crosslinker

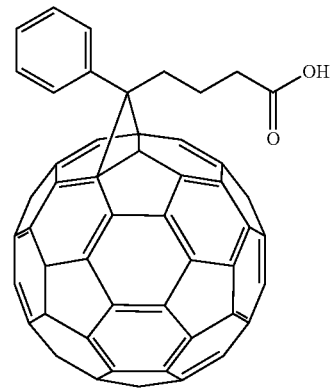

$C_{60}$ PCBA—the mono-carboxylic acid version of PCBM

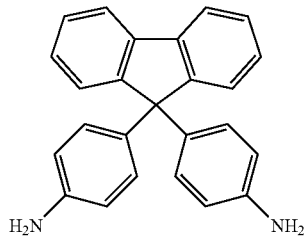 [SMILES: Nc1ccc(C2(c3ccc(N)cc3)c3ccccc3-c3ccccc32)cc1]

Fluorene dianiline crosslinker—4,4' (9 Fluorenylidene)dianiline

This formulation offered improved thermal stability and increased carbon content 87.6% Carbon for the $C_{60}$ bis-PCBA with fluorene dianiline crosslinker 87.5% Carbon for the Mixed multiadduct-PCBA with fluorene dianiline crosslinker Preparation of Hard Mask Solution from Solids Prepare solution of bis-PCBA in cyclohexanone at the concentration of 50 grams/liter, using ultrasonic agitation to aid process as required. Filter with cyclohexanone compatible syringe filters, pore size 0.02 µm or equivalent (50 grams/liter is slightly above the solubility limit).

Prepare solution of fluorene dianiline crosslinker in cyclohexanone at the concentration of 50 grams/liter, using ultrasonic agitation to aid process as required.

Mix equal volumes of each solution to give the required volume of hard mask solution. Use ultrasonic agitation to aid mixing.

Substrate Pretreatment

Substrates should be clean and dry prior to applying the hard mask solution. Standard wafer cleaning and drying methods may be applied as appropriate. In some circumstances it has been found beneficial to spin deposit the hard mask film layers onto a hydrophobic (i.e. HF cleaned) surface.

No specific pre-spin dehydration bake is necessary, unless required to prevent disruption to the hard mask film due to outgassing of any underlying films during the post spin bake at 300° C.

Note—The material is not compatible with the use of HMDS adhesion promoter

Coating of Hard Mask and Crosslinking Bake Requirements

Whilst good quality films have been spun from the PCBA/dianiline hard mask formulations and promising thermal stability and etch data is presented in the table on pages 2 and 3, (from ~120 nm thick films given a crosslinking bake of 250° C. for 5 mins), the material requires further work as the performance of the solutions have been shown to change with time (stored at 5° C.) in that The spin speed thickness relationship changes The thickness of films spun with a given set of conditions increases and The amount of baking required to fully crosslink the material reduces i.e. reduced crosslinking bake temperature or reduced time It is suggested that the material is crosslinking in solution.

| | |
|---|---|
| CL06-10 crosslinker | Poly[(o-cresyl glycidyl ether)-co-formaldehyde |
| EEP | Ethyl 3-ethoxypropionate |
| Fluorene dianiline crosslinker | 4,4' (9 Fluorenylidene)dianiline |
| MiMu-PCBM | Mixed multi-adduct PCBM |
| POLY-OCGEF | Poly[(o-cresyl glycidyl ether)-co-formaldehyde |

What is claimed is:

1. A composition for forming a spin-on hard-mask, comprising:

a) a fullerene derivative expressed by the general formula

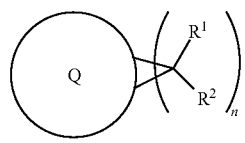

wherein n is an integer of 1-6, Q, the number of carbon atoms in the fullerene, is 60, 70, 76, 78, 80, 82, or 84, $R^1$ represents a first substituent comprising an ester, an alcohol, a phenol, an amine, an amide, an imide, or a carboxylic acid and $R^2$ represents a second substituent comprising hydrogen, a halogen, a $C_6$-$C_{20}$ aryl group, a $C_1$-$C_{20}$ alkyl group, an ester, an alcohol, a phenol, an amine, an amide, an imide, or a carboxylic acid, b) a crosslinking agent comprising two or more thermally or catalytically reactive groups, wherein the crosslinking agent is a polyaromatic, wherein the polyaromatic is 4,4'-(9-fluorenylidene) dianiline.

2. The composition of claim 1, further comprising one or more additional fullerene derivatives, wherein at least one of Q=60 and at least a second Q=70.

3. The composition of claim 2, further comprising one or more thermal acid generators.

4. The composition of claim 2, wherein $R^1$ is a carboxylic acid.

5. The composition of claim 2, wherein the crosslinking agent is chosen from an epoxy phenolic novolak resin, an epoxy cresylic novolak resin, an epoxy bisphenol A resin, an epoxy bisphenol A novolak resin, an epoxy bisphenol C resin, an alkylolmethyl melamine resin, an alkylolmethyl glycoluril resin, an alkylolmethyl guanamine resin, an alkylolmethyl benzo-guanamine resin, a glycosyl urea resin, or an alkyd resin.

6. The composition of claim 5, further comprising one or more thermal acid generators.

7. The composition of claim 6, wherein the one or more thermal acid generators are chosen from alkyl esters of organic sulfonic acids, alicyclic esters of organic sulfonic acids, amine salts of organic sulfonic acids, 2-nitrobenzyl esters of organic sulfonic acids, 4-nitrobenzyl esters of organic sulfonic acids, benzoin esters of organic sulfonic acids, β-hydroxyalkyl esters of organic sulfonic acids, β-hydroxycycloalkyl esters of organic sulfonic acids, triaryl sulfonium salts of organic sulfonic acids, alkyl diaryl sulfonium salts of organic sulfonic acids, dialkyl aryl sulfonium salts of organic sulfonic acids, trialkyl sulfonium salts of organic sulfonic acids, diaryl iodonium salts of organic sulfonic acids, alkyl aryl sulfonium salts of organic sulfonic acids, or ammonium salts of tris(organosulfonyl) methides.

8. The composition of claim 5, further comprising one or more photoacid generators.

9. The composition of claim 8, wherein the one or more photoacid generators are chosen from halogenated triazines, 2-nitrobenzyl esters of organic sulfonic acids, 4-nitrobenzyl esters of organic sulfonic acids, triaryl sulfonium salts of organic sulfonic acids, alkyl diaryl sulfonium salts of organic sulfonic acids, dialkyl aryl sulfonium salts of organic sulfonic acids, diaryl iodonium salts of organic sulfonic acids, alkyl aryl sulfonium salts of organic sulfonic acids, n-organosulfonyloxybicyclo[2.2.1]-hept-5-ene-2,3-dicarboximides, or 1,3-dioxoisoindolin-2-yl organosulfonates.

10. The composition of claim 5, wherein the crosslinking agent is chosen from an epoxidized phenolic resin, an epoxidized cresylic resin, an epoxidized bisphenol A resin, an expoxidized bis-phenol A novolak resin, an epoxy bis-phenol resin, an alkylolmethyl melamine resin, an alkylolmethyl glycoluril resin, an alkylolmethyl guanamine resin, an alkylomethy Benzo-Guanamine resin, a glycosyl urea resin, or an isocyanate resin.

11. The composition of claim 5, wherein the spin-on hard-mask further comprises one or more solvents chosen from polyethylene glycol monomethyl ether acetate, ethyl lactate, anisole, toluene, chloroform, chlorobenzene, o-dichloro benzene, m-dichloro benzene, p-dichloro benzene, o-xylene, m-xylene, p-xylene, carbon disulfide or combinations thereof.

12. A process for forming a spin-on hard-mask, comprising:
 a) providing a composition of claim 1,
 b) forming a coating on a substrate; and
 c) heating the substrate and the coating at a temperature sufficient to cross-link the coating.

\* \* \* \* \*